US008875527B2

(12) United States Patent
Muir et al.

(10) Patent No.: US 8,875,527 B2
(45) Date of Patent: *Nov. 4, 2014

(54) HEAT EXCHANGER FOR AN EQUIPMENT RACK (71) Applicant: Eaton-Williams Group Limited, Edenbridge (GB)

(72) Inventors: Jeffrey Muir, Hastings (GB); Dionysion Didymiotis, London (GB)

(73) Assignee: Eaton-Williams Group Limited (GB)

( * ) Notice: Subject to any disclaimer, the term of this patent is extended or adjusted under 35 U.S.C. 154(b) by 0 days.

This patent is subject to a terminal disclaimer.

(21) Appl. No.: 13/927,726

(22) Filed: Jun. 26, 2013

(65) Prior Publication Data
US 2013/0284405 A1    Oct. 31, 2013

Related U.S. Application Data (63) Continuation of application No. 12/910,464, filed on Oct. 22, 2010, now Pat. No. 8,479,528.

(30) Foreign Application Priority Data

Apr. 3, 2009  (GB) .................................. 0905870.2
Apr. 1, 2010  (WO) ................ PCT/GB2010/000665

(51) Int. Cl.
F25D 17/06       (2006.01)
H05K 7/20        (2006.01)
F28D 15/02       (2006.01)

(52) U.S. Cl.
CPC ............ F28D 15/02 (2013.01); H05K 7/20827 (2013.01)

USPC .............................................. 62/89; 62/259.2

(58) Field of Classification Search
CPC ......... F25D 17/06; F25B 31/006; F25B 37/00
USPC .............. 62/89, 259.2, 485, 434; 165/104.34, 165/908; 361/690, 687; 29/890, 464
See application file for complete search history.

(56) References Cited

U.S. PATENT DOCUMENTS 5,228,515 A *  7/1993  Tran .............................. 165/166
5,725,049 A    3/1998  Swanson et al.
(Continued)

FOREIGN PATENT DOCUMENTS

EP          1298975 A2       4/2003
WO       WO-03006910 A1     1/2003
WO      WO-2010112873 A1   10/2010

OTHER PUBLICATIONS

"U.S. Appl. No. 12/910,464, Amendment filed Mar. 27, 2013 in response to Non-Final Office Action mailed Jan. 16, 2013", 12 pgs.

(Continued)

Primary Examiner — Mohammad M Ali
(74) Attorney, Agent, or Firm — Schwegman Lundberg & Woessner, P.A.

(57) ABSTRACT

A heat exchanger includes an air channel configured to receive air from an equipment rack. A fluid circuit is provided having a bi-phase coolant flowing therethrough. The fluid circuit includes a coolant channel coupled to the equipment rack and positioned adjacent to the air channel. The bi-phase coolant is part liquid and part gas as the bi-phase coolant flows through the coolant channel. The bi-phase coolant is configured to condition the air flowing through the air channel.

20 Claims, 8 Drawing Sheets

(56) References Cited

U.S. PATENT DOCUMENTS

| | | | |
|---|---|---|---|
| 6,155,075 A | 12/2000 | Hanson | |
| 6,216,773 B1 | 4/2001 | Falta | |
| 6,357,240 B1 | 3/2002 | Zugibe | |
| 6,442,951 B1 | 9/2002 | Maeda | |
| 6,817,406 B1 * | 11/2004 | Inoue et al. | 165/115 |
| 6,966,196 B2 * | 11/2005 | Matsuki et al. | 62/305 |
| 7,041,260 B1 * | 5/2006 | Hong et al. | 422/198 |
| 7,077,193 B2 * | 7/2006 | Kamiyama et al. | 165/174 |
| 7,135,863 B2 * | 11/2006 | Arik et al. | 324/318 |
| 7,261,148 B2 * | 8/2007 | Rohrbaugh et al. | 165/158 |
| 7,411,785 B2 | 8/2008 | Doll | |
| 7,487,643 B2 * | 2/2009 | Chen et al. | 62/6 |
| 7,621,150 B2 | 11/2009 | Kadle | |
| 8,479,528 B2 | 7/2013 | Muir et al. | |
| 2003/0115894 A1 | 6/2003 | Podichereniaev | |
| 2006/0232945 A1 | 10/2006 | Chu et al. | |
| 2007/0062671 A1 | 3/2007 | Sugimoto | |
| 2007/0279861 A1 | 12/2007 | Doll | |
| 2008/0163644 A1 | 7/2008 | Kadle | |
| 2010/0000247 A1 * | 1/2010 | Bhatti et al. | 62/235.1 |
| 2010/0101765 A1 | 4/2010 | Campbell et al. | |

OTHER PUBLICATIONS

"U.S. Appl. No. 12/910,464, Non-Final Office Action mailed Jan. 16, 2013", 13 pgs.

"U.S. Appl. No. 12/910,464, Notice of Allowance mailed May 8, 2013", 8 pgs.

"U.S. Appl. No. 12/910,464, Post-Allowance Amendment filed Jun. 24, 2013", 10 pgs.

"International Application Serial No. PCT/GB2010/000665, International Preliminary Report on Patentability dated Oct. 4, 2011", 6 pgs.

"International Application Serial No. PCT/GB2010/000665, International Search Report mailed Aug. 16, 2010", 3 pgs.

"International Application Serial No. PCT/GB2010/000665, Written Opinion mailed Aug. 16, 2010", 5 pgs.

* cited by examiner

HEAT EXCHANGER FOR AN EQUIPMENT RACK

CROSS REFERENCE TO RELATED APPLICATION

The present application is a continuation of U.S. application Ser. No. 12/910,464 titled "Heat Exchanger for an Equipment Rack" filed Oct. 22, 2010, which relates to and claims priority from PCT Application Serial No. PCT/GB2010/000665 titled "A Rear Door Heat Exchanger and A Cooling Unit" filed Apr. 1, 2010, which claims priority to GB 0905870.2 titled "A Rear Door Heat Exchanger and A Cooling Unit" filed Apr. 3, 2009, the complete subject matter of each is hereby expressly incorporated by reference in its entirety.

BACKGROUND OF THE INVENTION

The subject matter described herein relates to heat exchangers and, more particularly, to a bi-phase heat exchanger for cooling air flowing through an equipment rack.

Data centers are typically cooled by perimeter cooling. Air to liquid heat exchangers are situated around the outside of the data center and air is pumped from the interior of the data center through the air to liquid heat exchangers. The air travels underneath the floor of the data center and then upwards through air vents in the flooring into aisles positioned between rows of equipment racks. The cool air in the aisles passes by convection between equipment positioned within the racks. Warm air is discharged on the opposite side of the row of racks into a warm aisle. The warm air in the warm aisle passes by convection to the air above the equipment racks. The warm air travels along a ceiling of the data center and downwards to the air to liquid heat exchangers. The air cycle is continuous to keep a temperature of the center at a predetermined level for efficient operation of the equipment.

As an operational capacity of the equipment increases, an increased amount of cooling is required in the data center. The cooling capacity of the perimeter cooling may be limited. Accordingly, air to water heat exchangers may be attached to the equipment racks. In particular, the air to water heat exchangers may be attached to the equipment rack at a location where the air flow exits from the rack. Such heat exchangers are generally referred to as rear door heat exchangers. A rear door heat exchanger uses water as a cooling medium because water has a relatively high specific heat in comparison to other coolants. The water supplied to the rear door heat exchangers is typically at normal room temperature or only slightly lower. In particular the temperature of the water may be within a range of 18° C. to 22° C. The temperature of the air exiting the equipment is generally in a higher range, for example, 35° C. to 45° C.

However, conventional rear door heat exchangers using water as a cooling medium are not always accepted by customers, due to policy decisions or just aversion to any risk of water in their environment. Using another medium such as refrigerant provides an alternative offering where water based systems can't be deployed. However, a specific heat capacity of conventional cooling mediums is generally lower than a specific heat capacity of water. Accordingly, conventional cooling mediums may not be capable of absorbing as much heat as water is capable of absorbing.

A need remains for a heat exchanger that operates with a coolant other than water while maintaining a sufficient cooling capacity.

SUMMARY OF THE INVENTION

In one embodiment, a heat exchanger is provided. The heat exchanger includes an air channel configured to receive air from an equipment rack. A fluid circuit is provided having a bi-phase coolant flowing therethrough. The fluid circuit includes a coolant channel coupled to the equipment rack and positioned adjacent to the air channel. The bi-phase coolant is part liquid and part gas as the bi-phase coolant flows through the coolant channel. The bi-phase coolant is configured to condition the air flowing through the air channel.

In another embodiment, a method of conditioning air flowing through an equipment rack is provided. The method includes joining a coolant channel to the equipment rack such that the air flowing through the equipment rack flows across the coolant channel. A bi-phase coolant is channeled into the coolant channel so that a liquid part of the bi-phase coolant separates from a gas part of the bi-phase coolant as the bi-phase coolant flows into the coolant channel. The bi-phase coolant is configured to condition the air flowing through the equipment rack.

In another embodiment, a cooling unit for an equipment rack is provided. The cooling unit includes a primary heat exchanger. A primary circuit is provided through which coolant is pumped. A portion of the primary circuit flows through the primary heat exchanger. A secondary circuit is provided through which a bi-phase coolant is pumped. A portion of the secondary circuit flows through the primary heat exchanger. The portions of the primary and secondary circuits flowing through the primary heat exchanger are thermally coupled so that the coolant in the primary circuit conditions the bi-phase coolant in the secondary circuit. The secondary circuit includes a coolant channel. A secondary heat exchanger is coupled to the equipment rack. The coolant channel of the secondary circuit flows through the secondary heat exchanger. The bi-phase coolant flowing through the coolant channel is part liquid and part gas. The bi-phase coolant flowing through the coolant channel is configured to condition air passing through the equipment rack.

In another embodiment, a method of conditioning air flowing through an equipment rack is provided. The method includes channeling coolant through a primary circuit and channeling bi-phase coolant through a secondary circuit. A portion of the primary circuit and a portion of the secondary circuit are thermally coupled so that the coolant in the primary circuit conditions the coolant in the secondary circuit. The bi-phase coolant in the secondary circuit is channeled through a coolant channel. The coolant channel is joined to the equipment rack. The bi-phase coolant flowing through the coolant channel is part liquid and part gas. The bi-phase coolant flowing through the coolant channel is configured to condition the air flowing through the equipment rack.

In one embodiment, a bi-phase coolant heat exchanger is provided. The bi-phase coolant is part gaseous and part liquid. The latent het of the transition between the liquid and gaseous states of the coolant is used to compensate for the relatively low specific heat of the coolant in its liquid state.

The bi-phase heat exchanger may have a coolant channel having multiple coolant conducting loops each connected at one end to a common inlet or upstream header. The other end of each coolant conducting loop is connected to a common outlet or downstream header. The coolant conducting loops provide balanced cooling through the heat exchanger.

The headers may be elongate and cylindrical. A diameter of the outlet header may be larger than a diameter of the inlet header to accommodate the creation of a bi-phase coolant at the connections between the coolant conducting loops and the common inlet header. In one embodiment, a ratio of the outlet header internal diameter to the inlet header internal diameter may be in the range from 1.1 to 1.5. In one embodiment, a ratio of 1.3 may be used with a R134a refrigerant (1,1,1,2-tetrafluoroethane).

Orifices may be provided at the ends of the coolant conducting loops, where the loops are connected to the inlet header. The orifices may include nozzles to create a bi-phase coolant in the loops.

The coolant conducting loops may extend generally horizontally to match a horizontal orientation of equipment in the equipment rack. Optionally, the coolant conducting loops may extend generally vertically and substantially perpendicular to the equipment in the equipment rack. In another embodiment, the coolant conducting loops may extend at an angle with respect to the orientation of the equipment in the equipment rack.

The headers may extend generally vertically. If the equipment rack door is hinged at one side, the headers may be positioned on the hinged side of the door to reduce the amount of movement of the headers when the door is opened and closed. Positioning the headers at the hinged side of the door facilitates a connection of the headers to the coolant conducting loops. In one embodiment, the headers may extend generally horizontally along a top and/or bottom of the equipment rack door. The headers may be provided at respective ends with respective quick release connectors, for example bayonet connectors.

The coolant may have a boiling point near normal room temperature, for example in a range from 15° C. to 25° C. to facilitate the bi-phase construction of the coolant. In one embodiment, the coolant may be R134a refrigerant (1,1,1,2-tetrafluoroethane).

In another embodiment, a cooling unit is provided. The cooling unit includes a primary circuit through which coolant fluid is passed when the unit is in use. A secondary circuit is provided through which bi-phase coolant fluid is passed when the unit is in use. Portions of the primary and secondary circuits are thermally coupled to one another within a primary heat exchanger. The primary heat exchanger may be a condenser. The bi-phase coolant fluid passes through the secondary circuit to at least one secondary heat exchanger positioned in a space which is to be cooled, for example, in proximity to the equipment rack. In one embodiment, the secondary heat exchanger is joined to the equipment rack. For example, the secondary heat exchanger may be joined to a rear door of the equipment rack. The secondary circuit includes a coolant channel that flows through the secondary heat exchanger. The bi-phase coolant fluid in the coolant channel is at least partially gaseous when the cooling unit is in use.

The cooling unit may include at least one pressure sensor connected thereto to monitor a pressure of the bi-phase coolant in the secondary circuit. The cooling unit may also include a parameter adjuster to adjust a parameter of coolant fluid in the primary circuit. The cooling unit may include a processor to receive signals from the at least one pressure sensor, and to issue signals to the parameter adjuster. The parameter adjuster adjusts a parameter of the coolant fluid in the primary circuit based on the signals from the at least one pressure sensor. Adjusting a parameter of the coolant fluid in the primary circuit changes the pressure of the bi-phase coolant fluid in the secondary circuit to control a temperature of the bi-phase coolant in the secondary heat exchanger.

The cooling unit may include a temperature and humidity sensor located in the space to be cooled. The temperature and humidity sensor are connected to the processor. The processor issues signals to the parameter adjuster to maintain the temperature of the bi-phase coolant fluid in the secondary heat exchanger above the dew point of the air in the space being cooled as indicated by the temperature and humidity sensor.

The parameter of the coolant in the primary circuit that is adjusted may be the flow of coolant through the primary circuit. The parameter adjuster may be a variable control valve or a variable pump that controls the flow of the coolant in the primary circuit The unit may include a separator connected in the secondary circuit downstream of the coolant channel. The separator separates the gas of the bi-phase coolant from the liquid of the bi-phase coolant. The separator may deliver the gaseous part of the bi-phase coolant to the primary heat exchanger. The liquid part of the bi-phase coolant may bypass the primary heat exchanger.

The cooling unit may include a reservoir connected to the secondary circuit to hold a reserve amount of liquid of the bi-phase coolant in the secondary circuit. The reservoir may be connected to a part of the secondary circuit that bypasses the primary heat exchanger.

A method of cooling a space is provided, wherein the method includes passing coolant fluid through a primary circuit and passing a bi-phase coolant fluid through a secondary circuit. Portions of the primary circuit and the secondary circuit are thermally coupled within a primary heat exchanger, for example a condensor. A secondary heat exchanger is positioned within a space to be cooled, for example, proximate to an equipment rack. The bi-phase coolant fluid passing through the secondary circuit is channeled to a coolant channel flowing through the secondary heat exchanger. The bi-phase coolant fluid in the coolant channel is at least partially gaseous. The bi-phase coolant fluid in the coolant channel is in a bi-phase state. A parameter of the coolant fluid in the primary circuit may be changed to change the pressure of the bi-phase coolant fluid in the secondary circuit, thereby controlling the temperature of the bi-phase coolant in the secondary heat exchanger. The coolant in the secondary circuit may be R134a refrigerant (1,1,1,2-tetrafluoroethane).

BRIEF DESCRIPTION OF THE DRAWINGS

FIG. 7b illustrates a cross-sectional view of the nozzle shown in FIG. 7a.

DETAILED DESCRIPTION OF THE DRAWINGS

The foregoing summary, as well as the following detailed description of certain embodiments will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Figure 1:
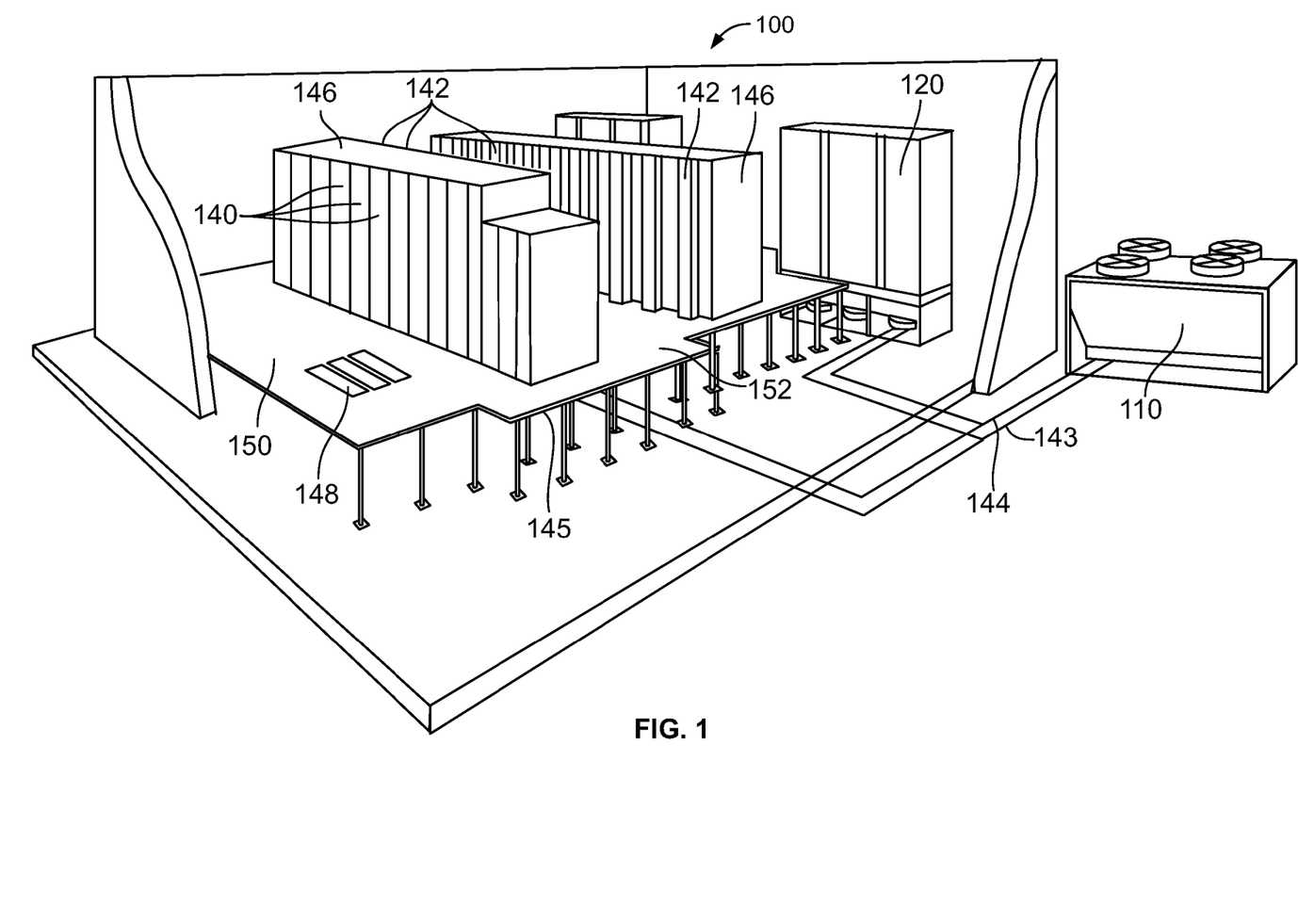
FIG. 1 illustrates a perspective side view of a data center incorporating secondary heat exchangers formed in accordance with an embodiment.
Figure 2:
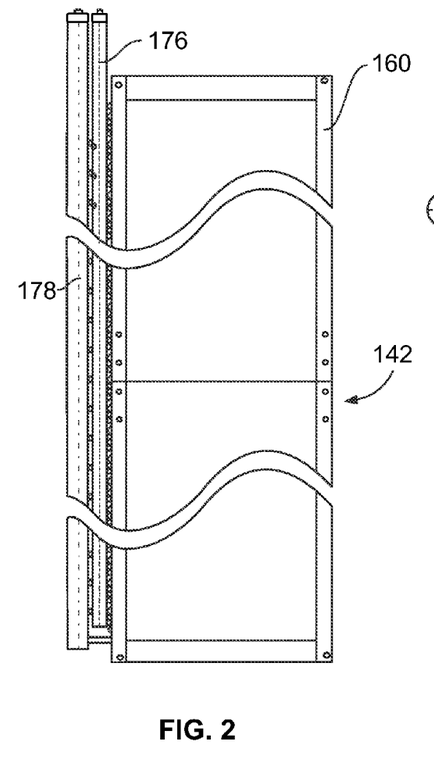
FIG. 2 illustrates a rear elevational view of a secondary heat exchanger formed in accordance with an embodiment.

FIG. 1 illustrates a data center 100 provided with a chiller unit 110 that supplies coolant, for example, cooling water to a perimeter cooling unit 120. The chiller unit 110 may also provide coolant to a primary heat exchanger 204 (shown in FIG. 8). Although, the embodiments described herein are described with respect to a data center 100, it should be understood that the embodiments described herein may be used to cool any space. For example, the space may be a data center, a telecommunications center or room, an information technology center or room, a data storage equipment center or room, and/or another room or space containing electronic equipment. The data center 100 is provided with rows of equipment racks 140. The equipment racks 140 are configured to retain electrical equipment. The electrical equipment may include multiple server racks, blade server racks and/or other pieces of equipment, for example, chassis or enclosures for mounting IT equipment or other equipment. The equipment racks 140 are provided with respective secondary heat exchangers 142 that are in fluid communication with the primary heat exchanger 204. In one embodiment, the secondary heat exchangers 142 are rear door heat exchangers joined to a rear door of the equipment rack 140. In an alternative embodiment, the secondary heat exchangers 142 may be joined to any part of the equipment rack 140. For example, the secondary heat exchangers 142 may be joined to a front of the equipment rack 140. In another embodiment, the secondary heat exchangers 142 may be positioned within the equipment rack 140. Chilled water from the chiller unit 110 is pumped through a feed pipe 143 to the perimeter cooling unit 120. Warm water returns from the perimeter cooling unit 120 to the chiller 110 through piping 144.

The perimeter cooling unit 120 and the equipment racks 140 rest on a raised floor 145. The equipment racks 140 are arranged in rows 146. Air vents 148 are provided in the raised floor 145 in one or more cool aisles 150 between rows 146. Adjacent warm aisles 152 do not include vents 148. The cool aisles 150 alternate with the warm aisles 152. When the data center 100 is in use, warm air in a warm aisle 152 rises upwardly and draws cool air from the cool aisles 150 through the racks 140. A continual draft of cool air is generated through the racks 140. The warm air rises toward the ceiling of the data center 100 and outwardly toward the perimeter cooling unit 120 where the warm air is cooled and falls downward to exit the perimeter cooling unit 120 underneath the raised flooring 145. The current of air continues with the cool air rising upward through the vents 148 to continue the air cooling cycle.

The secondary heat exchangers 142 provide additional cooling of the air flowing through the data center 100. A bi-phase coolant fluid flowing through the secondary heat exchangers 142 is provided by a cooling unit 153. The bi-phase coolant may have a boiling point near normal room temperature, for example in a range from 15° C. to 25° C. to facilitate a bi-phase construction of the bi-phase coolant. In one embodiment, the bi-phase coolant may be R134a refrigerant (1,1,1,2-tetrafluoroethane).

The construction of each secondary heat exchanger 142 is shown in greater detail in FIGS. 2 to 7. The secondary heat exchanger 142 includes a frame 160 (shown in FIG. 2) supporting metal tubing 162 (shown in FIG. 4a). The frame 160 is joined to one of the equipment racks 140. The tubing 162 forms coolant channels 159 (shown in FIG. 4b) through the secondary heat exchanger 142. The coolant channels 159 include multiple coolant loops or coils 164 (shown in FIGS. 4b and 6). In the illustrated embodiment, the coolant coils 164 extend horizontally with respect to the equipment in the equipment rack 140. Alternatively, the coolant coils 164 may extend vertically and/or at an angle with respect to the equipment in the equipment rack 140.

Figure 4A:
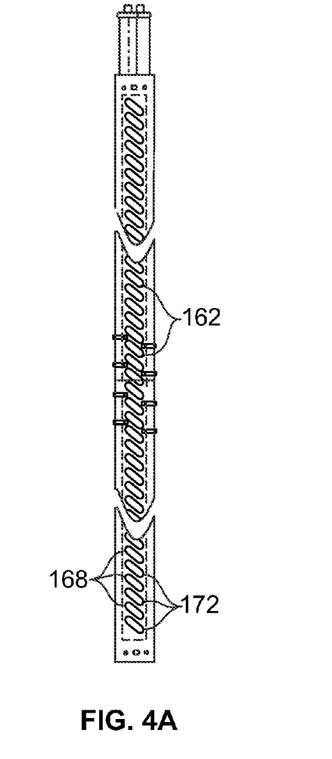
FIG. 4a illustrates a first side view of the secondary heat exchanger shown in FIGS. 2 and 3.
Figure 4B:
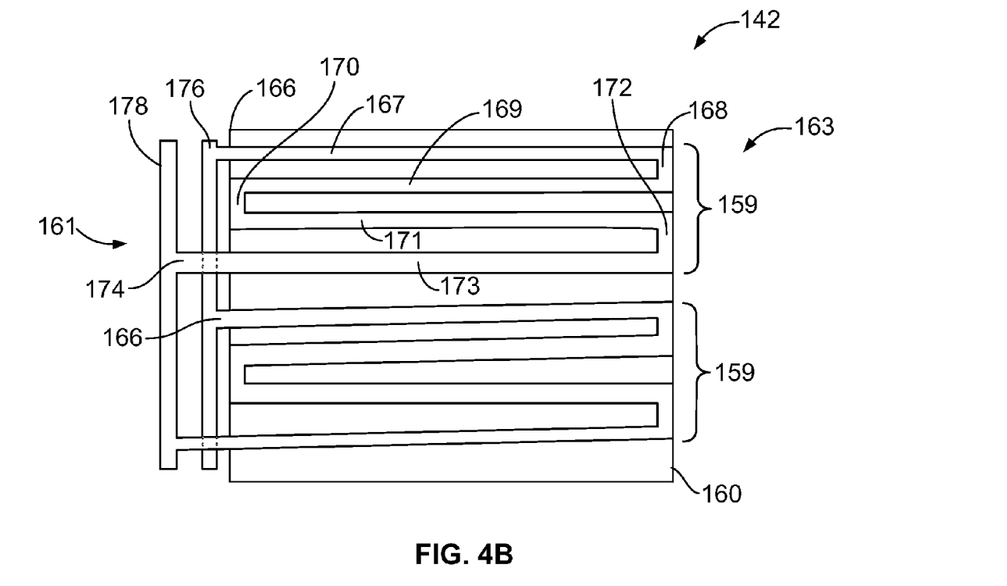
FIG. 4b illustrates a front view of the secondary heat exchanger shown in FIGS. 2 and 3.

FIG. 4b is a front view of the secondary heat exchanger 142. Each coolant channel 159 includes a coil inlet 166 positioned on a first side 161 of the frame 160. The coil inlet 166 joins to a section 167 of the coolant coil 164 that extends through to an opposite second side 163 of the frame 160 where it bends on a slant through a 180° curve 168. Another section 169 of the coolant coil extends from the curve 168 back to the first side 161 of the frame 160 where the coolant coil 164 passes through another slanting 180° curve 170. A section 171 of the coolant coil 164 extends from the curve 170 back to the second side 163 of the frame 160 where the coolant coil 164 extends through a third slanting 180° curve 172 into another section 173 of the coolant coil 164. The section 173 extends back to the first side 161 of the frame 160 to a coil outlet 174.

Each coil inlet 166 may be in fluid communication with a common inlet header 176. In one embodiment, the inlet header 176 is arranged substantially perpendicular to the equipment in the equipment rack 140. The inlet header 176 extends between a top and a bottom of the equipment rack 140. Optionally, the inlet header 176 may be arranged substantially parallel to the equipment in the equipment rack 140. For example, the inlet header 176 may extend between sides of the equipment rack 140. The inlet header 176 may be cylindrical and/or have any suitable shape. Each coil outlet 174 is connected to a common outlet header 178. In one embodiment, the outlet header 178 is arranged substantially perpendicular to the equipment in the equipment rack 140 and extends between the top and the bottom of the equipment rack 140. Optionally, the outlet header 178 may be arranged substantially parallel to the equipment in the equipment rack 140 and extend between the sides of the equipment rack 140. The outlet header 178 may be cylindrical and/or have any suitable shape. FIG. 4b illustrates the inlet header 176 and the outlet header 178 positioned on the first side 161 of the frame 160. Optionally, the inlet header 176 and the outlet header 178 may be positioned on the second side 163 of the frame 160. Alternatively, the inlet header 176 may be positioned on one of the first side 161 or the second side 163 of the frame 160 and the outlet header 178 may be positioned on the other of the first side 161 and the second side 163 of the frame 160.

Figure 4C:
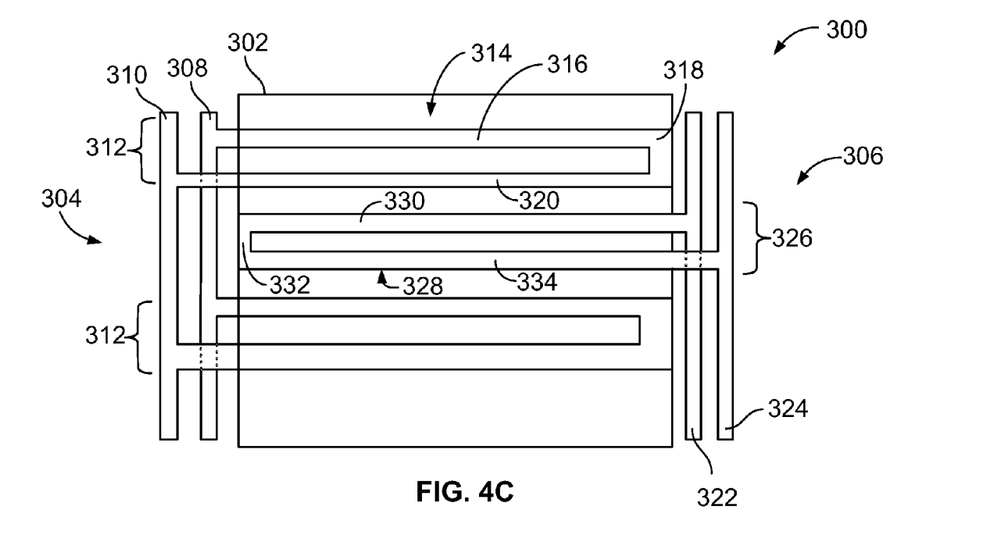
FIG. 4c illustrates a front view of a secondary heat exchanger formed in accordance with another embodiment.

FIG. 4c illustrates a secondary heat exchanger 300 formed in accordance with another embodiment. The heat exchanger 300 is coupled to a frame 302 having a first side 304 and a second side 306. The frame 302 may be attached to an equipment rack 140. The heat exchanger 300 includes a first inlet header 308 and a first outlet header 310 coupled to the first side 304 of the frame 302. At least one first coolant channel 312 includes multiple coolant coils 314 extending between the first side 304 and the second side 306 of the frame 302. A first coolant coil 316 extends from the first inlet header 308 to a curve 318 at the second side 306 of the frame 302. A second coolant coil 320 extends from the curve 318 to the first outlet header 310 on the first side 304 of the frame 302.

A second inlet header 322 and a second outlet header 324 are positioned on the second side 306 of the frame 302. At least one second coolant channel 326 includes multiple coolant coils 328 extending between the first side 304 and the second side 306 of the frame 302. A first coolant coil 330 extends from the second inlet header 322 to a curve 332 positioned on the first side 304 of the frame 302. A second coolant coil 334 extends from the curve 332 to the second outlet header 324 positioned on the second side 306 of the frame 302.

Figure 4D:
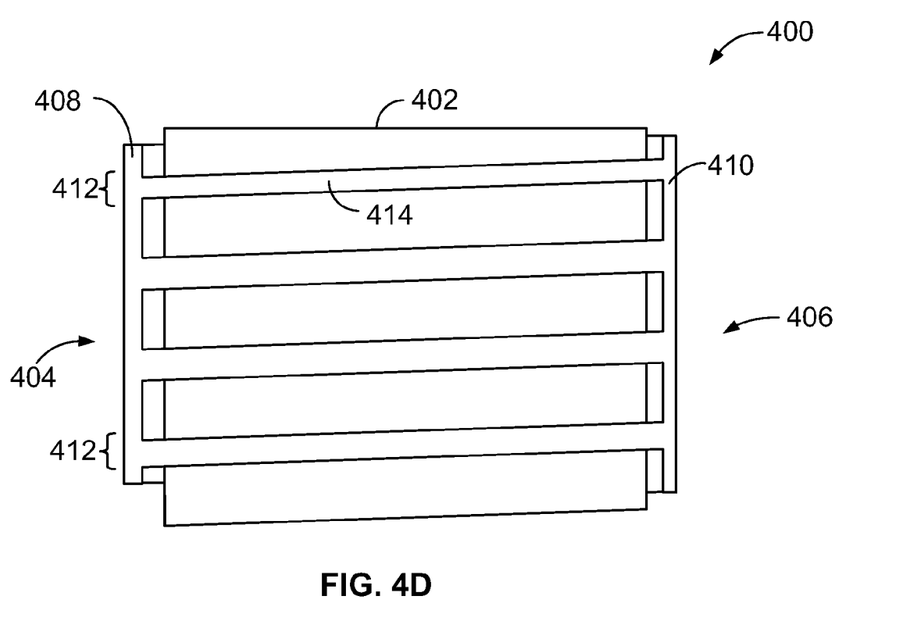
FIG. 4d illustrates a front view of a secondary heat exchanger formed in accordance with another embodiment.
Figures 5, 6:
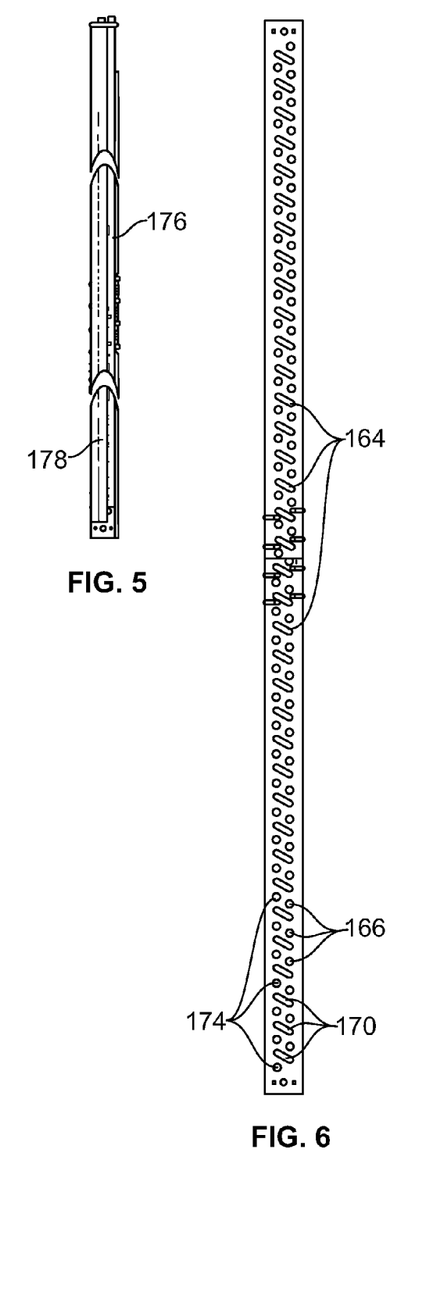
FIG. 5 illustrates a second side view of the secondary heat exchanger shown in FIGS. 2 and 3.
FIG. 6 illustrates a secondary heat exchanger formed in accordance with an embodiment and having parts thereof removed to reveal other parts of the secondary heat exchanger.

FIG. 4d illustrates a secondary heat exchanger 400 formed in accordance with another embodiment. The secondary heat exchanger 400 is coupled to a frame 402 having a first side 404 and a second side 406. The frame 402 may be coupled to an equipment rack 140. The secondary heat exchanger 400 includes an inlet header 408 positioned on the first side 404 of the frame 402 and an outlet header 410 positioned on the second side 406 of the frame 402. At least one coolant channel 412 extends from the first side 404 to the second side 406 of the frame 402. The coolant channel 412 includes a coolant coil 414. The coolant coil 414 extends between the inlet header 408 and the outlet header 410.

FIGS. 4b-4d illustrate various embodiments of secondary heat exchangers. It should be noted that the secondary heat exchangers of FIGS. 4b-4d are exemplary only and are not considered to be limiting. Other variations of secondary heat exchangers may be derived from the embodiments described herein. FIGS. 4b-4d illustrate secondary heat exchangers having various coolant channel configurations. In one embodiment, the configuration of the secondary heat exchanger is selected based on properties of the coolant channel, for example, a pressure gradient in the coolant channel, a velocity gradient of fluid flowing through the coolant channel, and/or an amount of heat exchange across the coolant channel.

Figure 3:
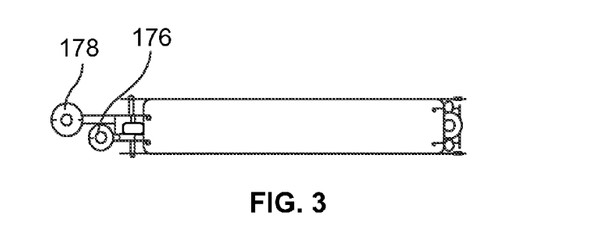
FIG. 3 illustrates a top view of the secondary heat exchanger shown in FIG. 2.

Referring to FIG. 3, the outlet header 178 and the inlet header 176 each have an internal diameter. In one embodiment, a ratio of the internal diameter of the outlet header 178 to the internal diameter of the inlet header 176 is within a range of 1.1-1.5. For example, the ratio of the internal diameter of the outlet header 178 to the internal diameter of the inlet header 176 may be approximately 1.3. In one embodiment, the internal diameter of the outlet header 178 is within a range of 30 mm to 54 mm and the internal diameter of the inlet header is within a range of 22 mm to 35 mm. In an example embodiment, the internal diameter of the outlet header 178 is 35 mm and the internal diameter of the inlet header 176 is 28 mm, giving a ratio of approximately 1.25.

Figure 7A:
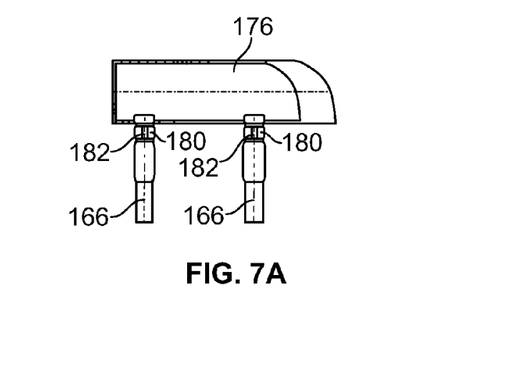
FIG. 7a illustrates an axial sectional view of parts of the secondary heat exchanger shown in FIGS. 1 to 6.
Figure 7B:
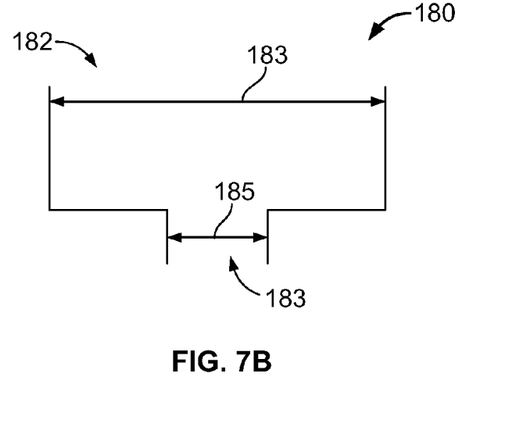

The inlet header 176 and the coil inlets 166 (shown in FIG. 7a) are connected via respective nozzles 180 (shown in FIGS. 7a and 7b). As shown in FIG. 7b, each nozzle 180 includes an inlet 182 and an outlet 183. The inlet 182 is joined to the inlet header 176 and the outlet 183 is joined to the coil inlet 166. The inlet 182 of the nozzle 180 has a diameter 185 that is greater than a diameter 185 of the outlet 183. The change in size between the diameter 185 of the inlet 182 and the diameter 185 of the outlet 183 increases a velocity of the bi-phase coolant as the bi-phase coolant enters the coolant channel 159 (shown in FIG. 4b). Increasing the velocity of the bi-phase coolant causes the liquid portion of the bi-phase coolant to separate from the gaseous portion of the bi-phase coolant in the coolant channel 159. Each coil outlet 174 is connected to the outlet header 178 such that the coolant channel 159 transfers the bi-phase coolant to the outlet header 178. The bi-phase coolant is transferred from the coolant channel 159 to outlet header 178 in a gaseous or a vaporized bi-phase state.

In one embodiment, the heat exchanger 142 is connected to an associated equipment rack 140 by way of hinges (not shown) located on the same side of the heat exchanger 142 as the inlet header 176 and the outlet header 178. The heat exchanger 142 is capable of being opened to provide access to the equipment rack 140. When the heat exchanger 142 is installed as shown in FIG. 1, the inlet and outlet headers 176 and 178 are connected to the chiller unit 110 by way of flexible tubing (not shown) that channels cooled liquid bi-phase coolant to the inlet header 176 and receives gaseous and/or vaporized bi-phase coolant from the outlet header 178. Coupling the inlet header 176 and the outlet header 178 to the hinged side of the heat exchanger 142 reduces a length of the flexible tubing required to allow the heat exchanger 142 to be opened or closed.

Numerous variations and modifications to the illustrated heat exchanger 142 may occur to the reader without taking the resulting construction outside the scope of the illustrated embodiments. For example, each coolant channel 159 may include more or fewer coolant coil sections. Each coolant coil 164 may be provided with one or more fins that may be oriented horizontally and/or vertically.

Figure 8:
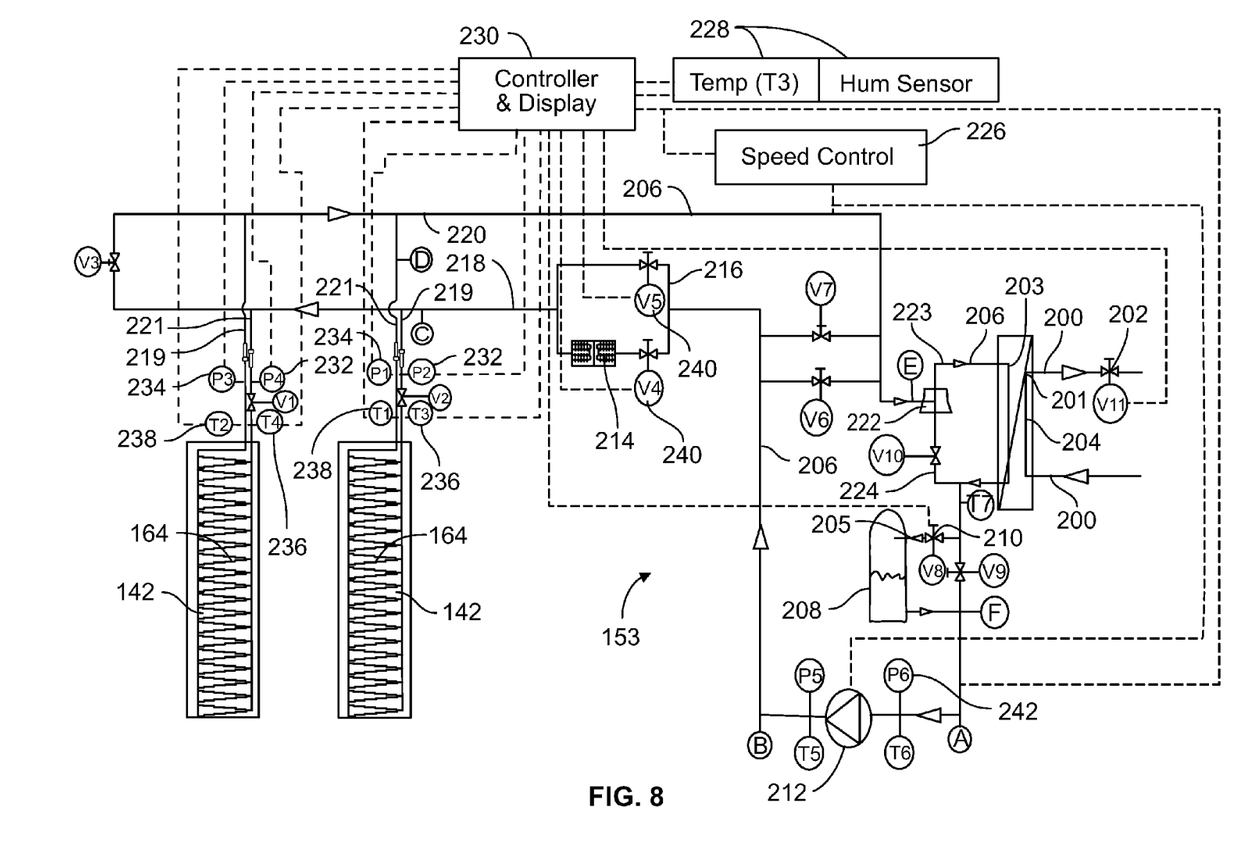
FIG. 8 illustrates an electrical and fluid circuit diagram of a cooling unit formed in accordance with an embodiment.

FIG. 8 illustrates a cooling unit 153 that includes secondary heat exchangers 142. The cooling unit 153 includes a primary circuit 200 through which coolant, for example, cooling water is passed when the cooling unit 153 is in use. A variable control valve 202 is provided in the primary circuit 200 to enable the flow of the coolant therethrough to be varied. A secondary circuit 206 is provided through which a bi-phase coolant flows. In one embodiment the bi-phase coolant is refrigerant R134a (1,1,1,2-tetrafluoroethane). A portion 201 of the primary circuit 200 and a portion 203 of the secondary circuit 206 flow through a primary heat exchanger 204. In one embodiment, the primary heat exchanger 204 is a condenser. The portion 201 of the primary circuit 200 and the portion 203 of the secondary circuit 206 are in thermal communication within the primary heat exchanger 204. The coolant in the primary circuit 200 conditions the bi-phase coolant in the secondary circuit 206 within the primary heat exchanger 204.

A coolant reservoir 208 is coupled in parallel to the secondary circuit 206. The coolant reservoir 208 is positioned downstream from the primary heat exchanger 204. An input 205 is coupled between the secondary circuit 206 and the coolant reservoir 208. The input 205 includes a control valve 210 to control the flow of the bi-phase coolant from the coolant reservoir 208 to the secondary circuit 206. The secondary circuit 206 includes a pump 212 positioned downstream of the coolant reservoir 208. The pump 212 is provided to pump the bi-phase coolant through the secondary circuit 206.

Downstream from the pump 212, a filter 214 is connected in parallel with a filter bypass 216 of the secondary circuit 206. The filter bypass 216 of the secondary circuit 206 bypasses the filter 214. Valves 240 are provided to direct the bi-phase coolant to the filter 214 and/or the filter bypass 216. An input line 218 and an output line 220 of the secondary circuit 206 are provided downstream of the filter 214.

Each secondary heat exchanger 142 includes an input 219 connected to the input line 218 and an output 221 connected to the output line 220. The bi-phase coolant in the secondary circuit 206 passes through the coolant coils 164 of the coolant channels 159 that flow through the secondary heat exchangers 142. The output line 220 of the secondary circuit 206 connects to a separator 222 having a first branch line 223 and a second branch line 224. The first branch line 223 connects to the primary heat exchanger 204. The second branch line 224 is in parallel with the primary heat exchanger 204 and bypasses the primary heat exchanger 204.

A pump speed control 226 is electrically connected to the pump 212 to control the pump 212. The cooling unit 153 is provided with a temperature and humidity sensor 228 located within the data center 100 to provide a measure of the temperature and/or humidity of the air in the data center 100.

The cooling unit 153 includes a controller and display 230. The controller and display 230 is connected to the cooling unit 153 to receive signals from respective pressure meters 232 that measure the pressure of the bi-phase coolant fluid in the inputs 219 of the secondary heat exchangers 142. In one embodiment, the controller and display 230 receives signals from respective pressure meters 234 that measure the pressure of the bi-phase coolant in the outputs 221 of the secondary heat exchangers 142. In one embodiment, the controller and display 230 receives signals from respective thermometers or temperature sensors 236 that measure the temperature of the bi-phase coolant in the inputs 219 of the secondary heat exchangers 142. In one embodiment, the controller and display 230 receives signals from respective thermometers or temperature sensors 238 that measure the temperature of the bi-phase coolant in the outputs 221 of the secondary heat exchangers 142. The controller and display 230 may also receive signals from the temperature and humidity sensor 228 indicative of a temperature and humidity in the data center 100.

The controller and display 230 may be connected to the variable valves 240 to control the flow of the bi-phase coolant through the filter bypass 216 of the secondary circuit 206. The controller and display 230 may be connected to the variable control valve 210, the pump 212 and/or the variable control valve 202.

Figure 9:
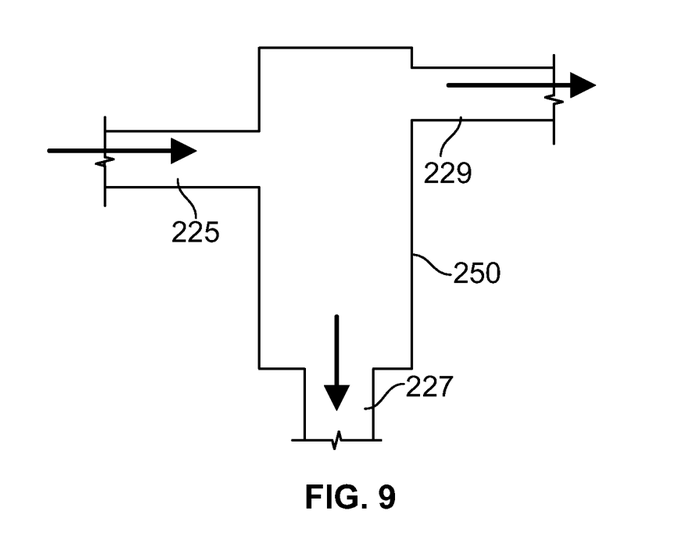
FIG. 9 illustrates an axial sectional view through a separator of the cooling unit shown in FIG. 8.

Further details of the separator 222 are shown in FIG. 9. The separator 222 includes a chamber 250 having an internal cross-sectional area substantially greater than the internal cross-sectional areas of the passageways 225, 227 and 229. The passageways 225, 227, and 229 from portions of the secondary circuit 206. The passageway 225 receives bi-phase coolant from the secondary heat exchangers 142. The passageway 227 extends downwardly from the lower end of the cylindrical chamber 250. The liquid portion of the bi-phase coolant flows through the passageway 227 and bypasses the primary heat exchanger 204. The gaseous portion of the bi-phase coolant flows through the passageway 229 and into the primary heat exchanger 204. The gaseous portion of the bi-phase coolant is condensed in the primary heat exchanger 204 into a liquid that is mixed with the liquid portion of the bi-phase coolant downstream from the primary heat exchanger 204.

The cooling unit 153 operates as follows. Coolant flows through the primary circuit 200 and bi-phase coolant flows through the secondary circuit 206. The coolant in the primary circuit 200 conditions the bi-phase coolant in the secondary circuit 206 within the primary heat exchanger 204. The pump 212 pumps the bi-phase coolant in the secondary circuit 206 to the filter 214 and/or along the filter bypass 216 to the secondary heat exchangers 142. The bi-phase coolant flows into the inlet header 176 of the secondary heat exchanger 142. The nozzles 180 discharge the bi-phase coolant from the inlet headers 176 into the coolant channel 159. In one embodiment, the inlet headers 176 have a greater pressure than the coolant channel 159. Accordingly, the bi-phase coolant experiences a pressure drop as the bi-phase coolant is discharged into the coolant channel 159. The pressure drop increases a velocity of the bi-phase coolant as the bi-phase coolant flows through the coolant channel 159. Additionally, the narrowing diameter of the nozzle 180 further increases the velocity of the bi-phase coolant. The increased velocity of the bi-phase coolant causes the liquid portion of the bi-phase coolant to separate from the gaseous portion of the bi-phase coolant.

Figure 10:
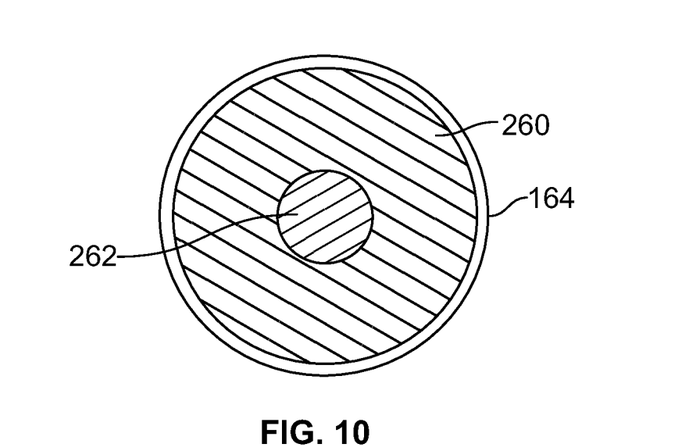
FIG. 10 illustrates a cross-sectional view of a coolant coil of the secondary heat exchanger shown in FIG. 8.

FIG. 10 shows a cross-sectional view a coolant coil 164 of the coolant channel 159 having bi-phase coolant flowing therethrough. The increased velocity of the bi-phase coolant forces the liquid portion 260 of the bi-phase coolant outward against an inner surface of the coolant coil 164. The gaseous portion 262 of the bi-phase coolant flows through a central region of the coolant coil 164. During the transition between the liquid state and the bi-phase state, the bi-phase coolant releases latent heat. The release of latent heat from the bi-phase coolant increases a specific heat capacity of the liquid portion of the bi-phase coolant such that the bi-phase coolant has an increased capacity for absorbing heat from the air in the equipment rack 140 (shown in FIG. 1). In one embodiment, the liquid portion of the bi-phase coolant has a specific heat capacity similar to the specific heat capacity of water.

In one embodiment, the bi-phase coolant exits the secondary heat exchanger 142 at a pressure of about 5.2 bars±10%. The bi-phase coolant is then passed in the bi-phase state to the separator 222. In the separator, the heavier liquid portion 260 of the bi-phase coolant falls into the lower half of the chamber 250. The lighter gaseous portion 262 of the bi-phase coolant rises into the uppermost part of the chamber 250. The gaseous portion 262 of the bi-phase coolant flows from the passageway 229 to the primary heat exchanger 204 where it is condensed into liquid form. The condensed liquid passes from the primary heat exchanger 204 and is mixed with the liquid portion 260 of the bi-phase coolant that descended through the passageway 227 of the separator 222. The mixed liquid coolant returns to the pump 212 to continue the cycle.

The controller and display 230 controls the speed control 226 which in turn controls the pump 212 to operate within a predetermined range of pump speeds. At the same time, in the event that the pressure sensor 242 issues signals to the controller and display 230 below a predetermined value that would create a risk of cavitation within the pump 212, the controller and display 230 issues a signal to the speed control 226 to lower the speed of the pump 212.

In the event that the signals issued by the temperature and humidity sensor and the temperature sensors 236 and 238 indicate that the temperature of the coolant within the coolant coils 164 is unacceptably close to the dew point of the air in the date center 100, the controller and display 230 issues a signal to the valve 202 in the primary circuit 200 to reduce the available cross-sectional area through the valve 202 and reduce the flow rate of coolant through the primary heat exchanger 204. Reducing the flow rate of the coolant through the primary heat exchanger 204 increases the pressure and the temperature of the bi-phase coolant in the secondary circuit 206.

Figure 11:
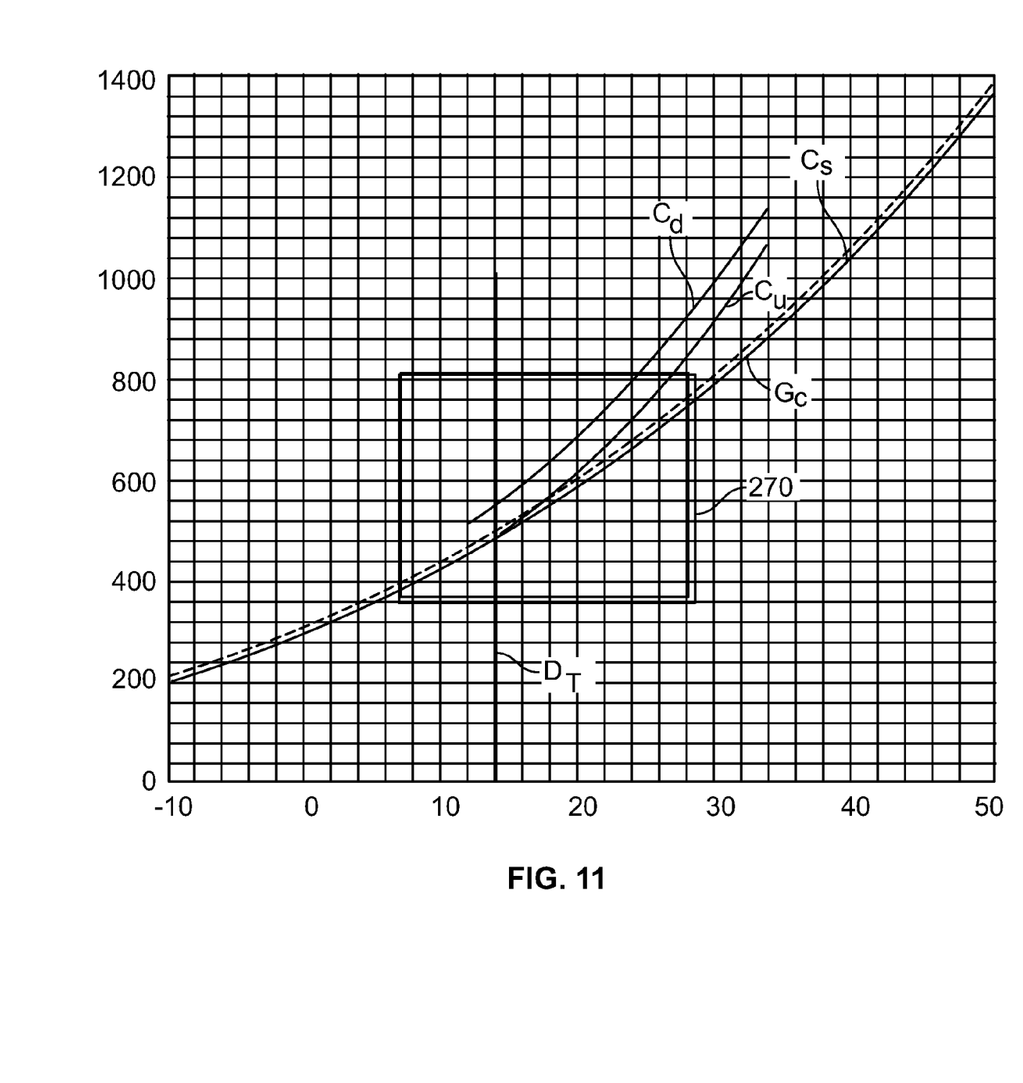
FIG. 11 is a graph illustrating the operation of a cooling unit formed in accordance with an embodiment.

FIG. 11 shows a representation of the relationships between different variables in the apparatus of FIG. 8 and the data center shown in FIG. 1. In this graph, temperature in degrees centigrade is indicated along the horizontal axis and pressure in KPa is indicated along the vertical axis. Thus, the dew point within the data center 100 is represented by a vertical line $D_T$ in FIG. 11. The curve $C_c$ shows the saturation curve of the coolant in the said secondary circuit, the dotted curve $C_s$ shows the same curve with a safety margin factor built in to reduce the likelihood of condensation. The curve $C_u$ represents variation of system pressure as a function of the temperature of coolant immediately upstream of the pump 212, that is to say, on the suction side thereof, and $C_d$ is the same curve for the downstream or higher pressure side thereof. It can be seen therefore that the working region of the pump 212 must remain within the upper right-hand portion of the box 270.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the invention without departing from their scope. While the dimensions and types of materials described herein are intended to define the parameters of the various embodiments of the invention, the embodiments are by no means limiting and are exemplary embodiments. Many other embodiments will be apparent to those of skill in the art upon reviewing the above description. The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments of the invention, including the best mode, and also to enable any person skilled in the art to practice the various embodiments of the invention, including making and using any devices or systems and performing any incorporated methods. The patentable scope of the various embodiments of the invention is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A heat exchanger comprising:
    a first fluid circuit having a bi-phase coolant flowing therethrough, the fluid circuit including a coolant channel configured to be positioned adjacent to an air channel, the bi-phase coolant being part liquid and part gas as the bi-phase coolant flows through the coolant channel, the bi-phase coolant configured to condition the air flowing through the air channel; and
    a second fluid circuit having a coolant flowing therethrough, wherein the coolant in the second fluid circuit conditions the bi-phase coolant in the first fluid circuit.

2. The heat exchanger of claim 1, wherein the first fluid circuit includes an inlet header coupled to the coolant channel, the inlet header having a pressure that is greater than a pressure of the coolant channel, a pressure drop from the inlet header to the coolant channel separating the liquid of the bi-phase coolant from the gas of the bi-phase coolant in the coolant channel.

3. The heat exchanger of claim 1, wherein the first fluid circuit includes a nozzle that discharges the bi-phase coolant into the coolant channel, the nozzle separating the liquid of the bi-phase coolant from the gas of the bi-phase coolant in the coolant channel.

4. The heat exchanger of claim 1, wherein a velocity of the bi-phase coolant through the coolant channel separates the liquid of the bi-phase coolant from the gas of the bi-phase coolant.

5. The heat exchanger of claim 1, wherein the first fluid circuit includes a separator positioned downstream from the coolant channel, the separator separating the liquid of the bi-phase coolant from the gas of the bi-phase coolant.

6. The heat exchanger of claim 1, wherein the first fluid circuit includes an inlet header and an outlet header, the coolant channel including a plurality of coolant conducting loops extending between the inlet header and the outlet header.

7. The heat exchanger of claim 1, wherein the first fluid circuit includes an inlet header and an outlet header coupled to the coolant channel, a diameter of the outlet header being larger than a diameter of the inlet header to facilitate separating the liquid of the bi-phase coolant from the gas of the bi-phase coolant in the coolant channel.

8. The heat exchanger of claim 1, wherein the first fluid circuit includes an inlet header and an outlet header coupled to the coolant channel, an internal diameter of the outlet header being 1.1 to 1.5 times larger than an internal diameter of the inlet header.

9. The heat exchanger of claim 1, wherein the bi-phase coolant includes R134a refrigerant.

10. The heat exchanger of claim 1, wherein the coolant channel is configured to be hingedly attached to a door of an equipment rack.

11. The heat exchanger of claim 1 further comprising headers coupled to the coolant channel, the headers configured to be coupled to a door of an equipment rack adjacent to a hinge of the door.

12. The heat exchanger of claim 1 further comprising headers coupled to the coolant channel, the headers configured to be coupled to the equipment rack with quick release connectors.

13. The heat exchanger of claim 1 further comprising headers coupled to the coolant channel, the headers configured to be coupled to an equipment rack with bayonet connectors.

14. A method of conditioning air flowing through an equipment rack comprising:
    channeling a bi-phase coolant into a coolant channel so that a liquid part of the bi-phase coolant separates from a gas part of the bi-phase coolant as the bi-phase coolant flows into the coolant channel, the bi-phase coolant configured to condition the air flowing through the equipment rack; and
    conditioning the bi-phase coolant with a separate and distinct coolant.

15. The method of claim 14 further comprising channeling the bi-phase coolant from an inlet header to the coolant channel, wherein the inlet header has a pressure that is greater than a pressure of the coolant channel, a pressure drop from the inlet header to the coolant channel separating the liquid of the bi-phase coolant from the gas of the bi-phase coolant in the coolant channel.

16. The method of claim 14 further comprising channeling the bi-phase coolant from a nozzle to the coolant channel to separate the liquid of the bi-phase coolant from the gas of the bi-phase coolant in the coolant channel.

17. The method of claim 14 further comprising channeling the bi-phase coolant through the coolant channel at a velocity that separates the liquid of the bi-phase coolant from the gas of the bi-phase coolant.

18. The method of claim 14 further comprising channeling the bi-phase coolant from the coolant channel to a separator to separate the liquid of the bi-phase coolant from the gas of the bi-phase coolant.

19. The method of claim 14, wherein the bi-phase coolant has a boiling point within a range of 15° C. to 25° C.

20. The method of claim 14, wherein the bi-phase coolant comprises R134a refrigerant.

* * * * *